United States Patent [19]

Tran et al.

[11] Patent Number: 5,235,195
[45] Date of Patent: Aug. 10, 1993

[54] SOLID STATE ELECTROMAGNETIC RADIATION DETECTOR WITH PLANARIZATION LAYER

[75] Inventors: Nang T. Tran, Cottage Grove, Minn.; Neil W. Loeding, Wills Point, Tex.; David V. Nins, deceased, late of St. Paul, Minn., by Mary J. Nins, administrator

[73] Assignee: Minnesota Mining and Manufacturing Company, St. Paul, Minn.

[21] Appl. No.: 963,063

[22] Filed: Oct. 19, 1992

Related U.S. Application Data

[63] Continuation of Ser. No. 564,632, Aug. 8, 1990, Pat. No. 5,182,624.

[51] Int. Cl.$^5$ .................................... H01L 27/14
[52] U.S. Cl. .................................... 257/59; 257/291; 257/448; 257/444; 257/292
[58] Field of Search ................ 257/59, 290, 291, 292, 257/293, 443, 444, 446, 448

[56] References Cited

U.S. PATENT DOCUMENTS

| | | | |
|---|---|---|---|
| 3,539,803 | 11/1970 | Beerman | 250/83 |
| 3,809,920 | 5/1974 | Cohen et al. | 307/88 |
| 3,846,820 | 11/1974 | Lampe | 357/31 |
| 3,906,544 | 9/1975 | Engeler et al. | 357/24 |
| 3,916,268 | 10/1975 | Engeler et al. | 357/23 |
| 3,973,146 | 8/1976 | Arnold et al. | 357/26 |
| 4,024,560 | 5/1977 | Miller et al. | 357/23 |
| 4,258,259 | 3/1981 | Obara et al. | 250/338 |
| 4,517,733 | 5/1985 | Hamano | 437/2 |
| 4,606,871 | 8/1986 | Krueger et al. | 264/22 |
| 4,608,749 | 9/1986 | Harada et al. | 437/3 |
| 4,615,848 | 10/1986 | Krueger et al. | 264/22 |
| 4,626,687 | 12/1986 | Nara et al. | 250/338 |
| 4,670,765 | 6/1987 | Nakamura et al. | 357/30 |
| 4,672,454 | 6/1987 | Cannella et al. | 358/213.11 |
| 4,675,739 | 6/1987 | Catchpole et al. | 350/213.11 |
| 4,689,487 | 8/1987 | Nishiki et al. | 250/361 |
| 4,694,317 | 9/1987 | Higasashi et al. | 357/30 G |
| 4,735,908 | 4/1988 | Higishi et al. | 437/2 |
| 4,739,384 | 4/1988 | Higashi et al. | 357/30 |
| 4,740,824 | 4/1988 | Yano et al. | 357/30 |
| 4,810,881 | 3/1989 | Berger et al. | 250/370.01 |
| 4,820,586 | 4/1989 | Krueger et al. | 428/421 |
| 4,826,777 | 5/1989 | Ondris | 437/2 |
| 5,130,259 | 7/1992 | Bahraman | 437/5 |

FOREIGN PATENT DOCUMENTS

| | | |
|---|---|---|
| 0125691 | 11/1984 | European Pat. Off. . |
| 58-182280 | 10/1983 | Japan . |
| 63-003454 | 6/1988 | Japan . |
| 02-3968 | 1/1990 | Japan . |

OTHER PUBLICATIONS

Sherr, "Matrix and Alphanumeric Devices", *Electronic Displays*, pp. 182-319 (1979), Wiley & Sons, N.Y.
Hamano et al., "An Amorphous Si High Speed Linear Image Sensor", Proceedings of the 13th Conference on Solid State Devices, Tokyo, 1981; Japanese Journal of Applied Physics, vol. 21 (1982) Supplement 21-1, pp. 245-249.
McGill et al., "Amorphous-Silicon Alloy Contact-Type Image Sensors", SID International Symposium, Digest of Technical Papers, First Edition, (May 1989), pp. 251-261.
Tsunemi et al., "Application of a Frame Transfer-Type CCD as an X-Ray Image Sensor", Japanese Journal of Applied Physics, vol. 27, No. 12, Dec. 1988, pp. 2404-2408.
Proceedings of Electronic Imaging West, Pasadena, Calif., pp. 210-213 (Feb. 25-28, 1990), Biac, "A Wide Field of View IR CCD Camera".

*Primary Examiner*—William Mintel
*Attorney, Agent, or Firm*—Gary L. Griswold; Walter N. Kirn; David B. Kagan

[57] ABSTRACT

The present invention provides a large area, high pixel density solid state radiation detector with a real-time and a non-destructive read-out. The solid state detector comprises a plurality of field effect transistors deposited onto a substrate to form an array. A planarization layer is deposited over the array of transistors. An energy sensitive layer is deposited onto the planarization layer. Means is provided for electrically connecting the energy sensitive layer with each transistor of the array. A top electrode layer is deposited onto the energy sensitive layer. The solid state detector also comprises circuitry means for providing electronic read-out from each FET of the array.

15 Claims, 6 Drawing Sheets

SOLID STATE ELECTROMAGNETIC RADIATION DETECTOR WITH PLANARIZATION LAYER

This is a continuation of application No. 07/564,632 filed Aug. 8, 1990, now U.S. Pat. No. 5,182,624.

FIELD OF THE INVENTION

The present invention relates to a solid state detector for detecting electromagnetic radiation, and more particularly to a large area, high pixel density solid state detector based on a two dimensional array of field effect transistors and an energy sensitive layer coating the array.

BACKGROUND OF THE INVENTION

Solid state electromagnetic radiation detectors have been developed for consumer, commercial, scientific, medical, military and industrial applications. Consumer applications range from video to high density television. Industrial uses include robotic and machine vision; electronics imaging for advertising and communication; integrated text; and images in office work and publishing. Image sensors are also used for medical (mammography, chest x-rays), astronomy, spectroscopy, surveillance, airport luggage inspection, inspection for foreign objects in foodstuffs, non-destructive testing in industry, and many other applications.

Solid state devices used for detecting electromagnetic radiation, such as x-rays, infrared radiation, ultraviolet radiation, and visible light, store the image momentarily and then, after a selected time interval, convert the image to an electrical signal. A variety of solid state detectors are known. One type of solid state detector is the "hybrid" detector. A hybrid detector generally comprises a pyroelectric material that is bonded to a field effect transistor ("FET"). The FET in such detectors is used as an amplification means to amplify the signal from the detector before the signal is sent to the read-out electronics. Crystalline pyroelectric materials such as strontium barium niobate, lead titanate, and triglycine sulfate ("TGS") are well known in the art. In addition, films of organic polymers such as polyvinylidene fluoride and polyacrylonitrile have also been used as pyroelectric materials.

For example, U.S. Pat. No. 3,809,920 teaches the use of a polyvinylidene fluoride film in conjunction with an FET as being an effective and useful infrared radiation detector.

U.S. Pat. No. 4,024,560 discloses an infrared detector which is a combination of a pyroelectric body secured by electrostatic bonding to the gate area of a field effect transistor such that the pyroelectric body is interposed between the semiconductor body and the gate electrode. In this position, the pyroelectric body forms the gate dielectric of the device. A pyroelectric crystal is typically cleaved, or cut, to form the pyroelectric body.

Japanese Kokai (Laid-Open) Publication JP58-182280 discloses a photodetector comprising a thin film FET and a pyroelectric material. The pyroelectric material forms the gate dielectric layer in this device.

Previously known hybrid structures suffer from a number of drawbacks. One drawback of hybrid structures concerns the pixel size of such devices. Generally, pixel size corresponds to the resolution of a detector. A smaller pixel size means a higher density of pixels for higher resolution. In previously known hybrid structures, the pyroelectric material has been positioned as the gate dielectric layer of the FET. As a result of this approach, achieving smaller pixel sizes has been limited by the size of the pyroelectric material. Because the pyroelectric material of these devices is individually bonded to the field effect transistor, it has been difficult to achieve pixel sizes on the order of 1 mm×1 mm or less.

As another drawback, the active detection area of such devices is, at most, only a few square centimeters in size.

As another drawback, hybrid structures tend to be susceptible to harm caused by events such as radiation induced damage. For example, if too much voltage is applied to such detectors, such voltage can irreparably damage the pyroelectric material, i.e., the gate dielectric layer, of the FET. This kind of damage could impair the performance of, or even destroy, the detector.

As a consequence of these drawbacks, previously known hybrid structures have not been practical for high density, large area applications.

Solid state detector arrays have also been known. One type of solid state detector array is the charged coupled device ("CCD"). In essence, a CCD is a shift register formed by a string of closely spaced MOS capacitors. A CCD can store and transfer analog-charge signals, either electrons or holes, that may be introduced electrically or optically.

In Japanese Journal of Applied Physics, vol. 27, no. 12, Dec. 1988, pp. 2404-2408, Hiroshi Tsunami et al. discuss the application of CCD's to take x-ray images of about 8 keV and 1.5 keV for different objects. High resolution CCD sensors which have more than 2 to 4 million pixels have also been reported, for example, in the Proceedings of Electronic Imaging West, Pasadena, Calif., pp. 210-213 (Feb. 25-28, 1990); and in Electronic, pp. 61-62 (Feb. 29, 1988).

The high cost of the CCD, however, has been a barrier to widespread commercial acceptance of these devices. CCD's, too, require an optical system in order to enlarge the field of view. The use of an optical system, unfortunately, causes a significant reduction in quantum efficiency. This makes it impractical to use the CCD for large area detectors. To date, the largest CCD array reported has been less than one square inch in size.

Amorphous silicon recently has become a material of choice in many solid state detector applications due to its capability for large area deposition and the low cost of amorphous silicon detectors. Amorphous silicon-based solid state detectors generally have been in the form of a linear array. Such devices have gained widespread acceptance for use as monolithic, full page high resolution detectors, due to the following advantages: (1) large area deposition capability, (2) low temperature deposition, (3) high photoconductivity, (4) spectral response in the visible light region and (5) high doping efficiency.

An amorphous silicon linear array is discussed by Toshihisa Hamano et al. (Proc. of the 13th Conference on Solid State Devices, Tokyo, 1981, Japanese Journal of Applied Physics, Vol. 21 (1982) supplement 21-1, pp. 245-249). In this structure, metal (Au, Ni, thickness of 3,000 angstroms) is used for the bottom electrode and Indium Tin Oxide transparent conducting film is used for the top electrode. Glass plates (Corning 7059, PYREX) are used for the substrate. Amorphous silicon (a-Si:H) film with a thickness of 1 micron is deposited by plasma-enhanced chemical vapor deposition technique onto the substrate.

For x-ray applications, U.S. Pat. No. 4,675,739 describes a solid state linear array made from photosensing elements. Each photosensing element includes back-to-back diodes: one a photoresponsive diode and the other, a blocking diode. Each of the diodes has an associated capacitance formed by its electrodes. The magnitude of the charge remaining on a given capacitor is sensed and relates back to the intensity of the incident radiation impinging upon the photosensitive diode. In this structure, an amplifying means, i.e., a field effect transistor is not used.

Solid state detectors in the form of a linear array, however, must be moved in order to get a two-dimensional image. This introduces a long read-out time, which makes real-time read-out impractical. This drawback prevents the linear array detector from being used in applications where high speed is required, e.g., medical x-ray applications.

U.S. Pat. No. 4,689,487 describes the use of a large area solid state detector (40 cm×40 cm). He solid state detector includes pixels in the form of a 2,000×2,000 matrix. Each pixel consists of a photodiode conductively connected in parallel to a capacitor. The photodiode and the capacitor are both then conductively connected to the drain of a metal-oxide-semiconductor field effect transistor (MOSFET). The photodiodes are of a polycrystalline or amorphous material. This diode-MOSFET device has at least four main drawbacks. First, a non-destructive read-out cannot be used. Second, the sensitivity of the device is low. Third, the diode has to be operated in the forward mode in order to turn on the transistor. Fourth, the device requires at least 8 complex microlithography and deposition steps for fabrication, causing yields to be low.

U.S. Pat. Nos. 4,606,871, 4,615,848, and 4,820,586 disclose a pyroelectric material that is a blend of polyvinylidene fluoride ("PVF$_2$") and at least one polymer miscible therewith at a temperature above the melting point of the PVF$_2$. The film may be polarized to render the PVF$_2$ blend pyroelectric and isotropically piezoelectric. Example 10 in each of these patents describes the coating of an integrated circuit slice of a single crystal silicon chip with the PVF$_2$ blend, followed by the sputtering of gold onto the surface of the PVF$_2$ for poling.

SUMMARY OF THE INVENTION

The present invention provides a large area, high pixel density, solid state detector with a real-time and a non-destructive read-out. It is believed that the solid state detector of the present invention is the first practical, large area, high pixel density solid state detector that is based on a two-dimensional array of field effect transistors ("FET's").

The solid state detector of the present invention comprises a plurality of field effect transistors ("FET's") deposited onto a substrate to form an array. A planarization layer is deposited over the array of FET's. An energy sensitive layer is deposited onto the planarization layer. Means is provided for electrically connecting the energy sensitive layer with each FET of the array. A top electrode layer is deposited onto the energy sensitive layer. The solid state detector also comprises circuitry means for providing electronic read-out from each FET of the array.

The present invention enjoys a unique combination of advantages. Because the energy sensitive layer is coated over the entire array of FET's, patterning or individual placement of the energy sensitive layer onto each FET is not required. This greatly simplifies the fabrication process, especially when the energy sensitive layer is relatively thick, i e., thicker than 10 microns. As a consequence, the solid state detector is amenable to mass production techniques so that large area, solid state detectors can be fabricated in large numbers at relatively low cost. Large area means that the detector may have a radiation detecting area greater in size than 10 cm×10 cm.

Further, the present invention also differs from previously known FET-containing, solid state detectors in that the energy sensitive layer of the present invention is not positioned as the gate dielectric layer of the FET's. Instead, the energy sensitive layer functions as an additional capacitance which is, in effect, connected in series with the gate capacitance of each FET of the array.

This approach provides at least two advantages. First, this approach provides solid state detectors with higher pixel density than previously known structures that are based on the FET. According to the present invention, pixel size is determined by the size of the gate region on each FET of the array. In preferred embodiments of the present invention comprising a plurality of thin film FET's, the gate region of each FET is extremely small. Sizes of from 20 microns×20 microns to 50 microns×50 microns are typical. As a result, pixel densities as high as 250,000 pixels/cm$^2$ can be achieved.

Second, this approach provides solid state detectors that are less susceptible to harm caused by events such as radiation induced damage. According to the present invention, it is the energy sensitive layer that protects the solid state radiation detector from such harm. If a high voltage is applied to the detector, the voltage of preferred embodiments will tend to drop mainly in the energy sensitive layer, whose capacitance is typically lower than the gate capacitance. In this way, damage to the FET's of the array is minimized.

The present invention is also a real-time detector. Read-out times of the detector of from 1 to 4 seconds are feasible. Read-out time is defined as the time elapsing between the time an object is subjected to illumination and the time an image appears on the monitor.

The present invention also has a non-destructive read-out. Non-destructive read-out means that the charge stored in the energy sensitive layer will discharge gradually over a period of time. This allows several readings to be taken at each exposure. The signal can then be averaged, thereby enhancing the signal to noise ratio.

DESCRIPTION OF THE PREFERRED EMBODIMENTS

Figure 1:
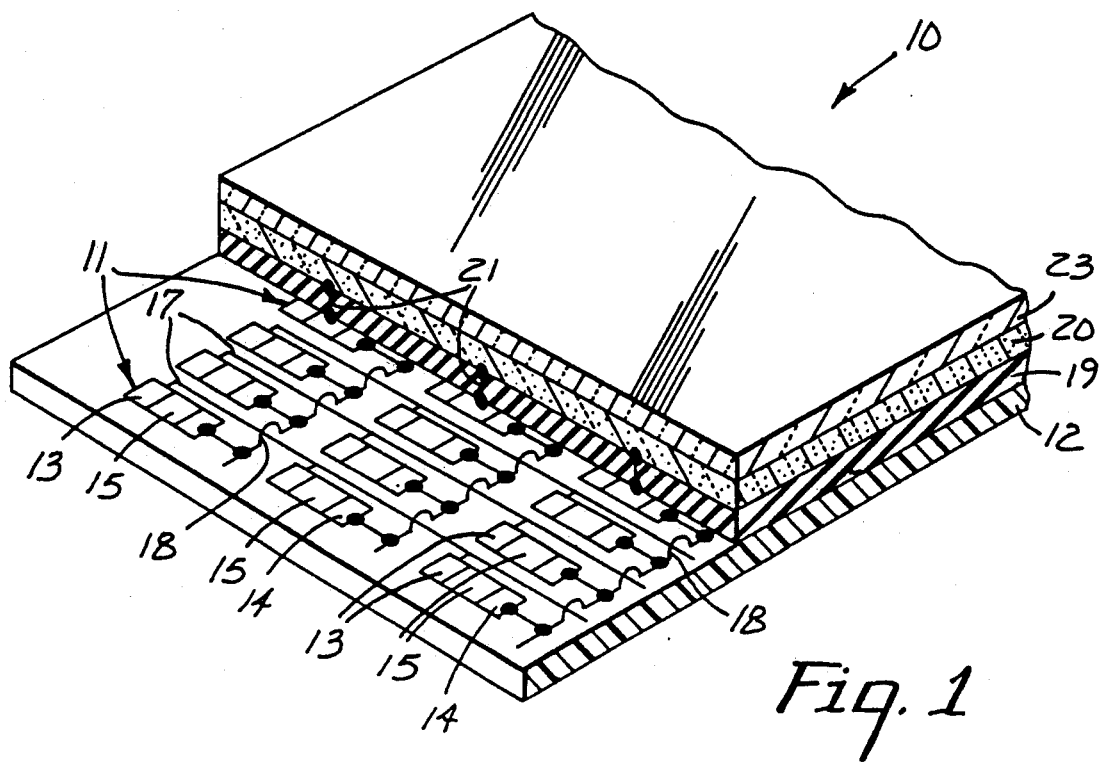
FIG. 1 is a cut-away isometric view of the solid state detector of the present invention shown in schematic with parts broken away and shown in section.
Figure 2:
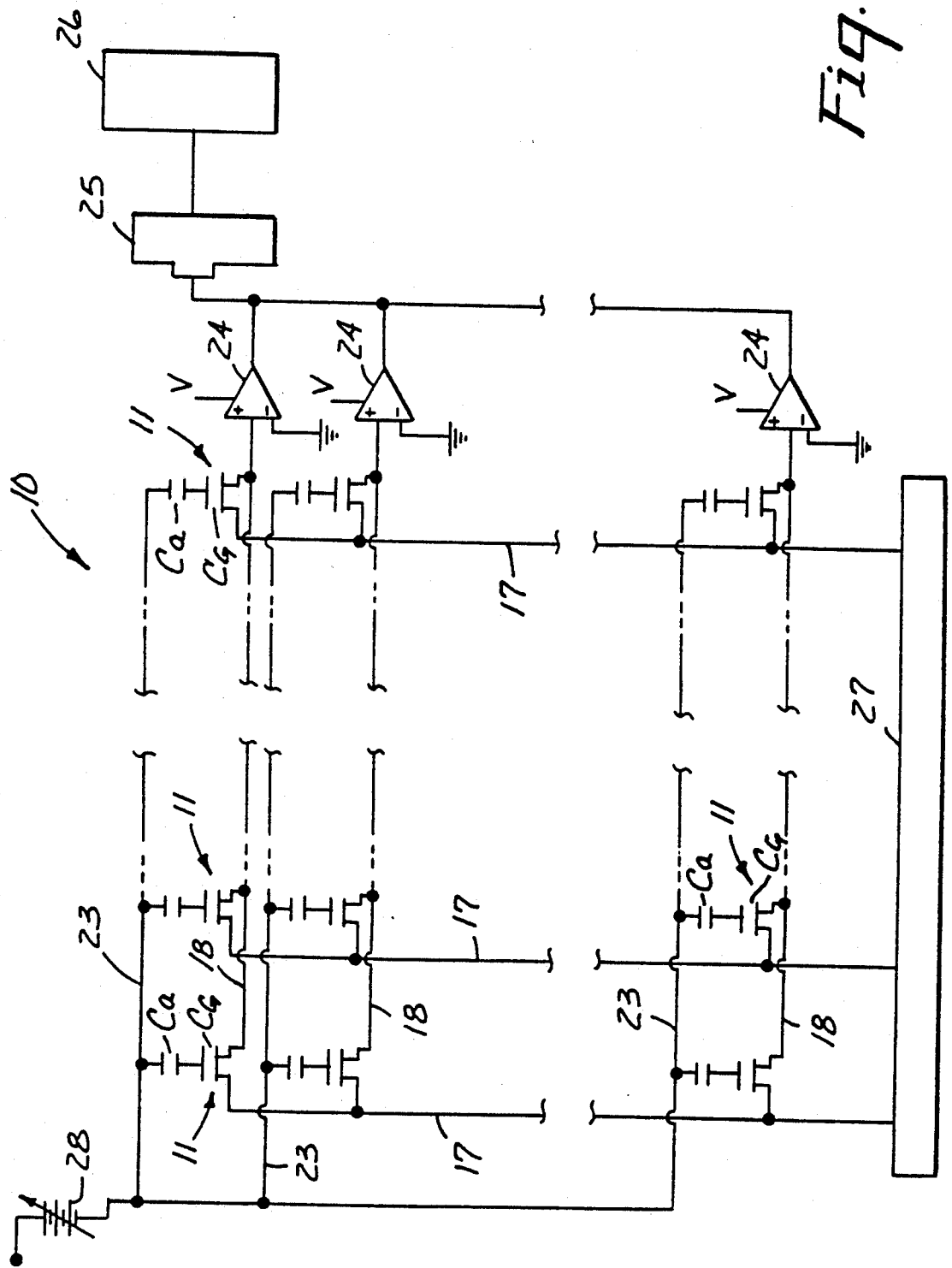
FIG. 2 is an electronic circuit diagram of the solid state detector of the present invention shown in FIG. 1.

A preferred solid state detector 10 of the present invention will now be described with reference to FIG. 1 and FIG. 2. A plurality of thin film, field effect transistors ("FET's") 11 are deposited onto a substrate 12 to form an array. Preferably, the FET's 11 are aligned on the substrate 12 in rows and columns as shown in FIG. 1. However, the FET's 11 may be arranged in other patterns on the substrate 12. For example, adjacent FET's 11 may be offset up, down, or diagonal from each other. Each of the FET's 11 has a source electrode 13, a drain electrode 14, and a gate electrode 15. As seen best in FIG. 2, each FET 11 also has a gate capacitance, $C_G$.

The solid state detector 10 comprises circuitry means for providing electronic read-out from each FET 11 of the array. The design requirements for such circuitry are described, for example, in L. Tannas, Jr., ed., *Flat Panel Displays and CRT's*, pp. 91-137 (1987); and S. Sherr, *Electronic Displays*, pp. 182-320 (1979). Preferably, the circuitry means comprises a plurality of source lines 17 linking the source electrodes 13 in each row of FET's 11 and a plurality of drain lines 18 linking the drain electrodes 14 in each column of FET's 11. For example, for an array comprising a 2000×2000 matrix of FET's, there will be 2000 source lines and 2000 drain lines in the solid state detector.

The various source lines 17 and drain lines 18 should not be in electrical contact with one another. That is, a source line should not contact other source lines or any of the drain lines, and a drain line should not contact other drain lines or any of the source lines. For this reason, at least one planarization layer 19 is deposited over the array of FET's 11 in order to electrically isolate the source lines 17 and the drain lines 18.

An energy sensitive layer 20 is deposited onto the planarization layer 19. Means 21 is provided for electrically connecting the energy sensitive layer 20 with each FET 11 of the array. Preferably, such means 21 electrically connects the energy sensitive layer 20 with the gate electrode 15 of each FET 11 of the array. As seen best in FIG. 2, using this preferred approach, the energy sensitive layer 20 functions as an additional capacitance, $C_a$, which is, in effect, electrically connected in series with the gate capacitance $C_G$ of each FET 11 in the array.

A top electrode layer 23 is deposited onto the energy sensitive layer 20 in order to complete the solid state detector 10. The top electrode layer 23 shown in FIG. 1 has not been patterned to form a plurality of top electrode elements. However, the top electrode layer 23 optionally may be patterned in a variety of ways, so long as the various top electrode elements are electrically connected together so as to form a common top electrode. For example, the top electrode layer 23 may be patterned such that there is one top electrode element for each FET 11 of the array. As another example, the top electrode layer 23 may be patterned such that there is one top electrode element for each row or column of FET's 11 in the array.

Generally, the solid state detector 10 works as follows. A power source 28 is used to apply a charge to the energy sensitive layer 20. Incident radiation causes a corresponding change in the charge of the energy sensitive layer 20. This change in charge, in turn, causes the gate voltage of the FET's 11 to increase or decrease, depending upon the type of FET used in the array. This change in voltage is detected as a difference in the drain-source current of the FET 11. The difference in current is then amplified and detected as an output signal by the read-out electronics. As seen in FIG. 2, one possible read-out electronics scheme may include operational amplifiers 24 for boosting the analog signal from the FET's 11. This analog signal is then converted into a digital signal by an A/D converter 25. The digital signal is then stored in the memory of a memory storage device 26. As is also shown in FIG. 2, source lines 17 are coupled to shift register 27.

Figure 3A:
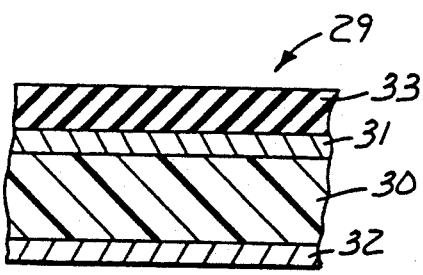
FIG. 3a is a side section of a substrate useful in the practice of the present invention.

Preferred substrates useful in the practice of the present invention are shown in FIGS. 3a, 3b, 3c, and 3d. FIG. 3a shows a substrate 29 comprising a flexible base layer 30. Generally, the base layer 30 is planar in shape. Useful materials for forming the flexible base layer 30 include stainless steel and polymers such as polyimide, polysulfone, or polyester. If the base layer 30 is formed from a polymeric material, the base layer 30 should be subjected to a conventional outgassing treatment before any other layers are deposited onto the base layer. Preferably, the base layer 30 has a thickness of about 50 microns.

When the base layer 30 is formed from a polymeric material, it is preferred that the base layer 30 is first coated on both sides with top and bottom layers 31 and 32 of stainless steel as described in assignee's copending application U.S. Ser. No. 07/471,670 filed Jan. 24, 1990, which is a continuation of U.S. Ser. No. 07/163,520 filed Mar. 2, 1988, now abandoned. Each of the stainless steel layers 31 and 32 preferably has a thickness of about 200 angstroms. The stainless steel is used to prevent or suppress the outgassing of low mass residual contaminants from the base layer 30.

Figure 3B:
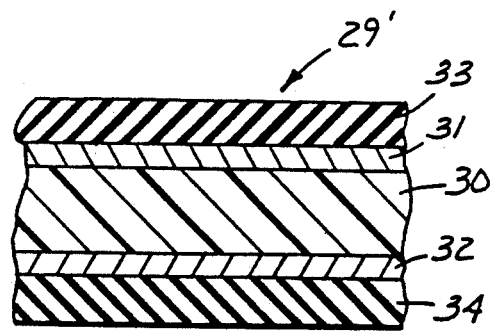
FIG. 3b is a side section of a substrate useful in the practice of the present invention.

Next, an insulating layer 33 is coated onto the top stainless steel layer 31. The insulating layer 33 is used to electronically isolate the base layer 30 from the field effect transistors subsequently deposited onto the substrate 29. The insulating layer 33 also helps prevent impurities in the base layer 30 from diffusing into the field effect transistors. The insulating layer 33 may be prepared from any suitable material such as $SiO_x$, $SiN_x$, silicon oxide nitride, or combinations thereof. Preferably, the insulating layer 33 has a thickness of about 1 micron. Optionally, an additional insulating layer 34 may be coated onto the bottom layer 32 of stainless steel as is shown in FIG. 3b for the substrate 29'.

Figure 3C:
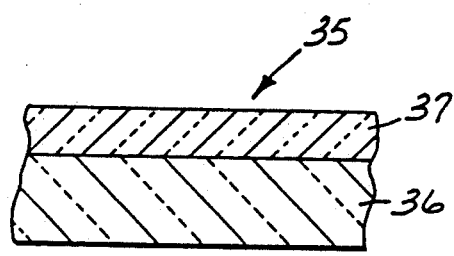
FIG. 3c is a side section of a substrate useful in the practice of the present invention.
Figure 3D:
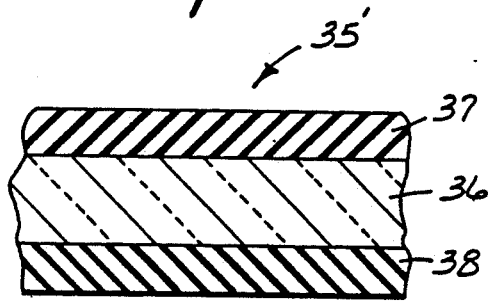
FIG. 3d is a side section of a substrate useful in the practice of the present invention.

Another embodiment of a substrate 35 useful in the practice of the present invention is shown in FIG. 3c. In FIG. 3c, the substrate 35 comprises a rigid, nonpolymeric base layer 36. Useful materials for forming the rigid base layer 36 include silicon, glass, quartz, alumina, or metal. In this embodiment, an insulating layer 37 may be preferably deposited directly onto the top surface of the base layer 36 as needed in order to prevent impurities from migrating from the base layer 36 into the FET's and/or to electronically isolate the FET's from the base layer 36. Optionally, as shown in FIG. 3d, an additional insulating layer 38 may be deposited onto the bottom surface of the base layer 36 of the substrate 35'.

Figure 4:
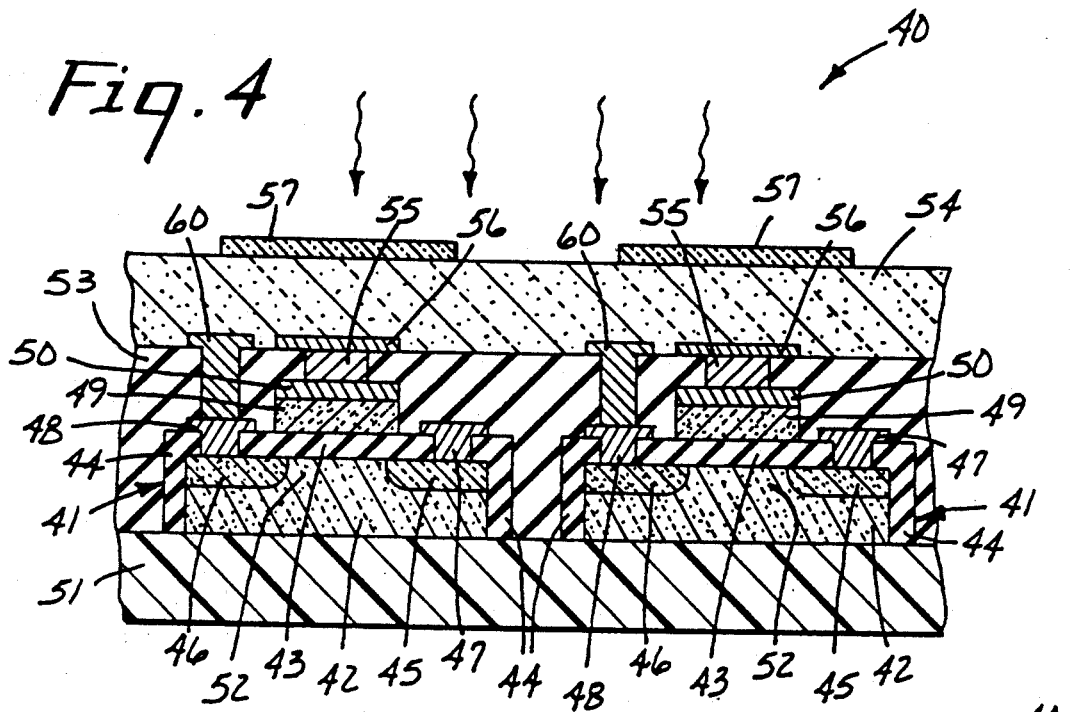
FIG. 4 is a side section of a solid state detector of the present invention.

FIG. 4 is a cross-section of a portion of a preferred solid state radiation detector 40 of the present invention, in which two thin film, metal-oxide-semiconductor field effect transistors ("MOSFET's") 41 of the array are shown. For purposes of clarity, source lines and drain lines are not shown in FIG. 4. As is known to those skilled in the art, each thin film MOSFET 41 generally comprises a channel layer 42; a gate dielectric layer 43, i.e., oxide layer; insulating shoulders 44; source and drain regions 45 and 46; source and drain electrodes 47 and 48; a polysilicon gate 49; and a gate electrode 50; each of which will be described in more detail below. In FIG. 4, the vertical dimensions of the various layers are greatly exaggerated for purposes of illustration. In actual practice, the total thickness of the solid state radiation detector 40 is from about 3 to about 600 microns.

As shown in FIG. 4, a channel layer 42 of an undoped semiconducting material is formed on the substrate 51 for each thin film transistor of the array. The channel layer 42 can be formed in a variety of ways. For example, a layer of the undoped semiconducting material can be deposited onto the substrate 51 and then etched or laser scribed to form the channel layer 42 for each MOSFET 41. Alternatively, a mask can be used to deposit the discrete islands of undoped semiconducting material onto the substrate 51 to directly form the channel layer 42.

The channel layer 42 may be formed from any undoped semiconducting material suitable for large area applications. Examples of such materials include hydrogenated amorphous silicon, cadmium selenide, single-crystal silicon, and polysilicon. Single-crystal silicon-based FET,s are well known in the art and are described, for example, in S. M. Sze, *Physics of Semiconductor Devices*, 2d edition, pp. 431-510 (1981).

When forming the channel layer 42 from hydrogenated amorphous silicon, the hydrogenated amorphous silicon may be deposited using plasma-enhanced chemical vapor deposition at 200° C. to 350° C. from a gaseous mixture of $SiH_4$ and hydrogen. Cadmium selenide may be deposited onto the substrate 51 by deposition techniques well known in the art. For example, by using a cadmium selenide source, thermal evaporation or sputtering techniques may be used to deposit the cadmium selenide. Alternatively, a cadmium layer and a selenium layer may be deposited onto the substrate 51 and then heat treated at 100° C. to 400° C. in an atmosphere comprising hydrogen selenide and argon in order to form the cadmium selenide layer. The cadmium and selenide layers may be deposited using electroplating or sputtering techniques.

Preferably, the channel layer 42 is formed from polysilicon. When forming the channel layer 42 from polysilicon, polysilicon can be deposited onto the substrate 51 using a variety of techniques, including:

(i) low pressure chemical vapor deposition at a temperature from 620° C. to 650° C.;

(ii) deposition of amorphous silicon by low pressure chemical vapor deposition at a temperature from 520° C. to 540° C., followed either by annealing at 620° C. to 1000° C. for 2 to 24 hours in a nitrogen atmosphere to form polysilicon, or by rapid thermal annealing at 620° C. for 1 to 4 minutes in a nitrogen atmosphere to form polysilicon;

(iii) deposition of amorphous silicon at 200° C. to 300° C. via plasma-enhanced chemical vapor deposition, followed by furnace annealing, laser annealing, or rapid thermal annealing;

(iv) high temperature chemical vapor deposition of polysilicon at 620° C., conversion of the polysilicon to amorphous silicon via ion implantation with silicon ions, followed by annealing at 620° C. for 4 to 24 hours to form polysilicon.

Typically, the channel layer 42 of undoped polysilicon has a thickness of from about 1000 to 3000 angstroms. Because polysilicon is deposited onto the substrate 51 at relatively high temperatures, the base layer of the substrate 51 for the polysilicon-based MOSFET's should comprise a material that does not degrade at such temperatures, e.g., quartz, silicon, alumina, or glass.

An oxide, i.e., gate dielectric, layer 43 and insulating shoulders 44 are formed on the channel layer 42. To accomplish this, a layer of an insulating material, such as $SiO_x$, $SiN_x$, silicon oxide nitride, or combinations thereof, is grown by thermal oxidation on the channel layer 42. The layer of insulating material is then etched, or laser scribed, to form the insulating shoulders 44 and the gate dielectric layer 43. This process also uncovers two spaced-apart surfaces on the channel layer 42 for the subsequent formation of source and drain electrodes 47 and 48, respectively.

A polysilicon gate 49 is deposited onto the gate dielectric layer 43. Typically, the polysilicon gate 49 has a thickness of about 500 to about 3500 angstroms. Preferably, the polysilicon gate 49 is deposited onto the layer of insulating material before the layer is etched, or laser scribed, to form the insulating shoulders 44 and the gate dielectric layer 43.

Using the polysilicon gate 49 and insulating shoulders 44 as a mask, the source and drain regions 45 and 46 are formed by using conventional ion implantation techniques to dope the source and drain regions 45 and 46 with either boron ions (p-type) or phosphorous ions (n-type). The ion concentration will vary with the particular electrical characteristics and sensitivity of the desired detector. As an example, ion concentrations of $1 \times 10^{14}$ ions/cm$^2$ to $9 \times 10^{15}$ ions/cm$^2$ are typical.

Ion implantation to form the source and drain regions 45 and 46 can occur either before or after the layer of insulating material is etched, or laser scribed, to form the insulating shoulders 44 and the gate dielectric layer 43. If ion implantation occurs before such etching or laser scribing, then the polysilicon gate 49 should be relatively thick in order to stop the ions from entering the channel region 52 beneath the polysilicon gate 49. Preferably, ion implantation occurs after such etching or laser scribing. One advantage of this preferred approach is that the polysilicon gate 49 may be relatively thinner, since less ion implantation energy is used to form the drain and source regions 45 and 46. As another advantage of the preferred approach, plasma hydrogenation treatment of the FET's 41 is easier when the polysilicon gate 49 is relatively thinner. Such treatment is used to passivate the grain boundaries of the channel layer 42.

The source and drain regions 45 and 46 may or may not be of the same conductivity type. For example, both the source and drain regions 45 and 46 may comprise either p-type ions or n-type ions. Alternatively, one of the regions may comprise p-type ions, and the other region may comprise n-type ions.

When forming the drain and source regions 45 and 46, use of the polysilicon gate 49 as a mask provides accurately defined source and drain regions 45 and 46. Even when the size of the FET's 41 is extremely small, i.e., 10 to 20 μm, ion implantation will occur in the source and drain regions 45 and 46, but not in the channel region 52 between the source and drain regions.

The various source electrodes 47, source lines (not shown in FIG. 4), drain electrodes 48, and gate electrodes 50 are simultaneously formed. Each source electrode 47 and drain electrode 48 is in ohmic contact with the source region 45 and drain region 46, respectively. Each gate electrode 50 is positioned in intimate contact with the polysilicon gate 49.

The various source electrodes 47, source lines, drain electrodes 48, and gate electrodes 50 may be formed by first growing a masking layer over the array. Portions of the masking layer corresponding to the positions of the source electrodes, source lines, drain electrodes, and gate electrodes are then selectively removed. The electrodes and source lines are then formed by vapor or sputter deposition of a suitable contact metal over the entire surface of the masking layer. Thereafter, unwanted metal is selectively removed from the masking layer by standard photolithographic and etching techniques.

Suitable contact metals for forming the electrodes and the source lines include the common contact metals, such as molybdenum, chromium, aluminum, silicon-doped aluminum, nickel, silver, tin, indium, palladium, titanium, copper, platinum, and the like. Typically, the electrodes and source lines have a thickness of from about 1000 to about 10,000 angstroms, and more commonly from about 1500 to about 5000 angstroms.

The array of FET's 41 thus formed is then annealed in a forming gas of nitrogen and hydrogen at about 400° C. for 30 minutes. Annealing enhances the quality of ohmic contact between the source electrode 47 and the source region 45 and between the drain electrode 48 and the drain region 46. Annealing is followed by a plasma hydrogenation treatment at about 300° C. for 10-60 minutes. This treatment passivates the grain boundaries of the channel layer 42 with hydrogen, thereby reducing the amount of leakage current from the FET's 41 of the array.

A planarization layer 53 is coated over the array of FET's 41. The planarization layer 53 is formed from an insulating material such as $SiO_x$, $SiN_x$, silicon oxide nitride, or combinations thereof. The planarization may also be formed from a polyimide such as Probimide 408 commercially available from Ciba-Geigy Corporation. Typically, the planarization layer 53 has a thickness of about 1 to 2 microns.

Figure 5A:
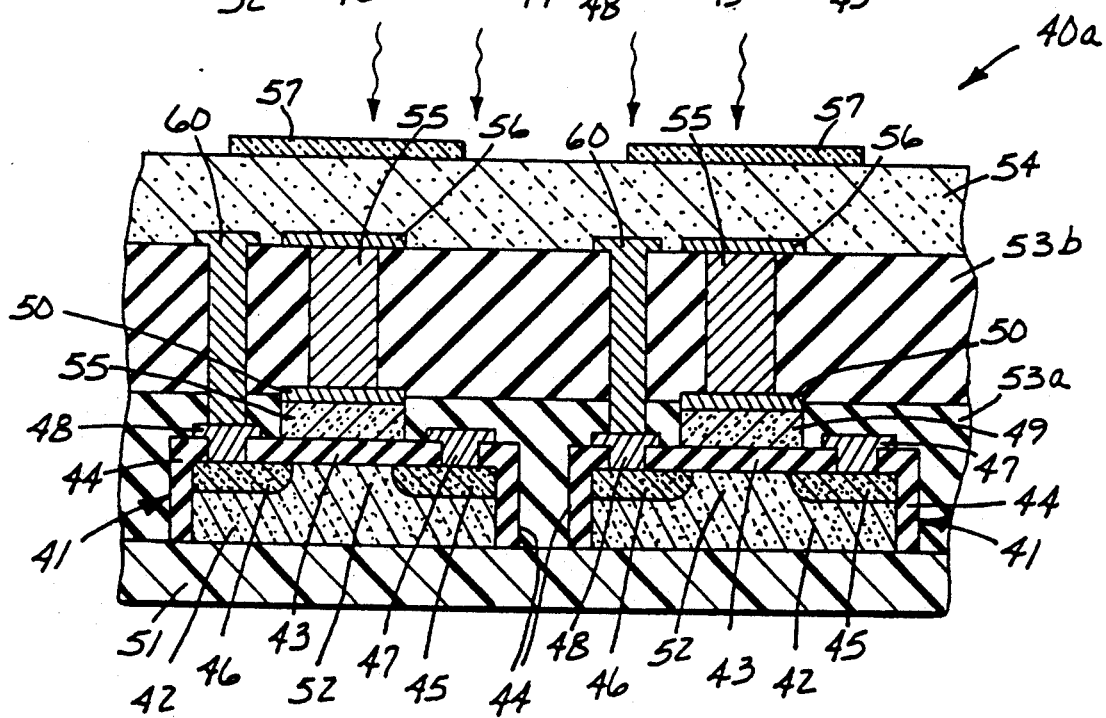
FIG. 5a is a side section of the solid state detector shown in FIG. 4, wherein the planarization layer has a double layer structure.
Figure 5B:
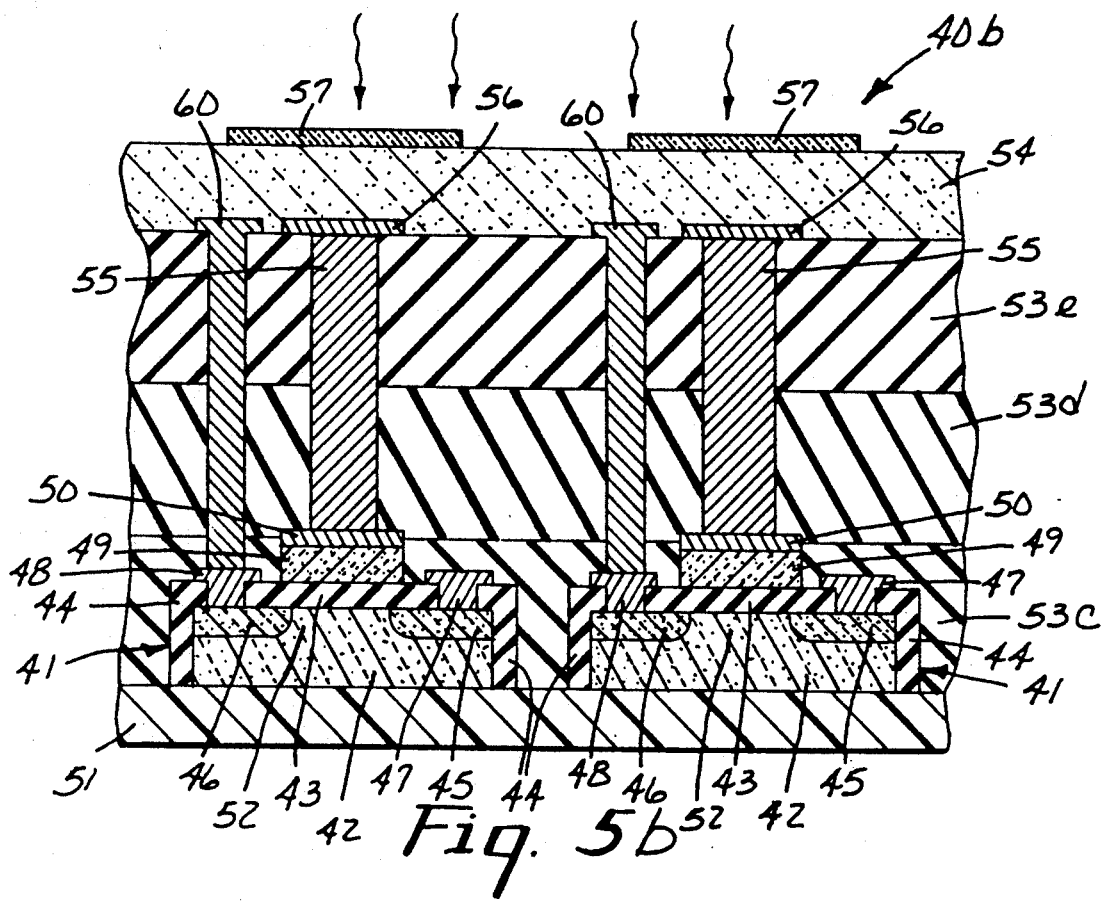
FIG. 5b is a side section of the solid state detector shown in FIG. 4, wherein the planarization layer has a triple layer structure.

In some cases, as shown in FIG. 5a for the solid state detector 40a, the planarization layer may be a double layer comprising a first layer 53a of $SiN_x$ having a thickness of about 3000 angstroms and a second layer 53b of $SiO_x$ having a thickness of about 3000 angstroms. Alternatively, as shown in FIG. 5b for the solid state detector 40b, the planarization layer may be a triple layer comprising a first layer 53c of $SiN_x$ having a thickness of 2000 angstroms, a second layer 53d of $SiO_x$ having a thickness of 2000 angstroms, and a third layer 53e of $SiN_x$ having a thickness of 2000 angstroms.

Preferably, the planarization layer 53 has a "planarized", i.e., smooth, upper surface. The planarization layer 53 may be planarized by coating the planarization layer with a 2 to 3 microns thick layer of a photoresist material. After forming the layer of photoresist material, the layer of photoresist material is etched down to the planarization layer to provide a smooth upper surface. Etching may be accomplished using reactive ion etching techniques in a gaseous mixture of $CF_4$ and $O_2$. The photoresist material should be selected so that the photoresist material has the same etch rate as the planarization layer 53. Examples of such photoresist materials found to be suitable in the practice of the present invention are, for example, Shipley AZ 5209 and Shipley AZ 5214. As another example, a planarized surface may be obtained when using Probimide 408 by first coating the material over the array of FET's to a thickness of 3 to 5 microns. After this, the Probimide 408 is etched until a smooth-surfaced layer having a thickness of about 1 to 2 microns is achieved. Such etching may be accomplished using a reactive ion etching technique in $O_2$ plasma. In those cases where the energy sensitive layer 54 is relatively thick, i.e., thicker than about 10 microns, it is not necessary to planarize the planarization layer 53.

An energy sensitive layer 54 is deposited onto the planarization layer 53 to further coat the array of thin film transistors 41. Preferably, the energy sensitive layer 54 is deposited as a continuous layer over the entire planarization layer 53 without the need for any patterning steps. Advantageously, this feature of the invention significantly simplifies the fabrication process, especially when the energy sensitive layer 54 is relatively thick, e.g., having a thickness of from about 10 to about 500 microns.

The energy sensitive layer 54 comprises a material for which incident radiation causes a corresponding change in the charge of the material. Many such materials are known and include amorphous selenium; cadmium telluride; cadmium selenide; cadmium sulfide; mercury cadmium telluride; selenium-based alloys; telluride-based alloys; selenium-tellurium; hydrogenated amorphous silicon and alloys thereof; polyvinylidene fluoride ("$PVF_2$"); a blend of $PVF_2$ and at least one polymer which is miscible with $PVF_2$; at a temperature above the melting point of $PVF_2$; vinyl fluoride; vinyl chloride; vinylidene chloride; chlorofluorovinylidene; trifluoroethylene; poly-N-vinyl-carbazole; trinitrofluorenone; lithium niobate; lithium tantalate; $Sr_{1-x}Ba_2O_x$; pyrargyrite; $Tl_3AsSe_3$; PbO; ZnO; organic photoconductive materials; and the like.

The various materials useful for forming the energy sensitive layer 54 may be sensitive to x-ray, ultraviolet, infrared, and/or visible electromagnetic radiation. For example, x-ray sensitive materials include amorphous selenium; cadmium selenide; cadmium telluride; mercury cadmium telluride; cadmium sulfide selenium-based alloys; tellurium-based alloys; selenium-tellurium; hydrogenated amorphous silicon and alloys thereof; PbO; ZnO; or combinations thereof. Ultraviolet sensitive materials include $PVF_2$; hydrogenated amorphous silicon and alloys thereof such as silicon carbide. Visible light sensitive materials include hydrogenated amorphous silicon and alloys thereof; amorphous selenium;

cadmium selenide; cadmium telluride; cadmium sulfide selenium-based alloys; telluride-based alloys; selenium-tellurium; mercury cadmium telluride; and organic photoconductive materials. Infrared, i.e., pyroelectric materials, include $PVF_2$; vinyl fluoride; vinylidene chloride; chlorofluorovinylidene; trifluoroethylene; lithium niobate; lithium tantalate; $Sr_{1-x}Ba_2O_x$; pyrargyrite; and $Tl_3AsSe_3$.

When using hydrogenated amorphous silicon and alloys thereof to form the energy sensitive layer 54, the amorphous silicon generally is doped to obtain a high resistivity, i.e., $10^{13}$ $\Omega$-cm, and a high photoconductivity, i.e., photocurrent to dark current ratio of $10^3$ to $10^4$. To provide an energy sensitive layer with such properties, the amorphous silicon may be doped with about 1 to 100 ppm of both boron and oxygen atoms. Alternatively, the amorphous silicon may be doped with about 1 to 100 ppm of chemical elements from Group VI of the Periodic Table, such as selenium or sulfur. Such doping techniques are well known in the art and are described, for example, in U.S. Pat. No. 4,265,991; Shimizu, Semiconductors and Semimetals, vol. 21, part D, Academic Press, pp. 55 to 73 (1984); and Shimizu, Journal of Non-Crystalline Solids, vols. 77 and 78, pp. 1363 to 1372 (1985).

After forming the planarization layer 53, drain leads 60, drain lines (not shown in FIG. 4), and means for electrically connecting the energy sensitive layer 54 with each FET 41 of the array are formed. Preferably, such means is formed such that the additional capacitance of the energy sensitive layer 54 is effectively connected in series with the gate capacitance, i.e., gate dielectric layer 43, of each FET 41 of the array. Such means preferably comprises a contact plug 55 and a bottom electrode 56.

The drain lead 60, drain line, contact plug 55, and bottom electrode 56 may be formed by first using standard etching or lift-off techniques to uncover the drain electrode 48 and gate electrode 50. After this, the drain lead 60, drain line, contact plug 55, and bottom electrode 56 are formed from a suitable contact metal, such as those metals described above with respect to the various electrodes and the source lines.

For infrared applications, the top electrode layer 57 may comprise a conductive, radiation absorbing material for which incident radiation causes the temperature of the material to change. Examples of such materials include metals such as nickel, aluminum, gold, tin, indium, palladium, titanium, copper, and base metals thereof. Of these materials, gold and aluminum are more preferred.

For other applications, the top electrode layer 57 may comprise a transparent, conductive material which allows incident radiation to pass through and be absorbed by the energy sensitive layer and which functions as an antireflection layer to maximize the amount of light photons that reach the energy sensitive layer. Examples of such materials include transparent conducting oxide ("TCO") materials, such as indium tin oxide, tin oxide, cadmium tin oxide, and zinc oxide. Stacked structures, such as a TCO/Ag/TCO structure or a $TCO/(Ag/TCO)_n$ structure where n is preferably an integer from 1 to 3, may also be used. Stacked structures are described, for example, in assignee's copending application, U.S. Ser. No. 280,838 filed Dec. 7, 1988, now U.S. Pat. No. 4,940,495.

The top electrode layer 57 can be formed by depositing the top electrode material over the entire energy sensitive layer 54. Optionally, the top electrode layer 57 may be patterned to form a plurality of discrete top electrode elements, wherein all of the discrete elements are electrically connected to form a common top electrode. Patterning may be accomplished by removing unwanted material in between the FET's 41 using standard etching techniques. Alternatively, using thermal evaporation or sputtering techniques, the common, top electrode elements can be deposited onto the energy sensitive layer 54 through a mask to directly form the discrete electrode elements without the requirement of a patterning step. Typically, the top electrode layer 57 has a thickness of from about 500 angstroms to 6000 angstroms for transparent conducting materials, and from 5000 angstroms to 3 microns for radiation absorbing materials. The lesser thicknesses are more responsive to incident radiation.

Figure 5C:
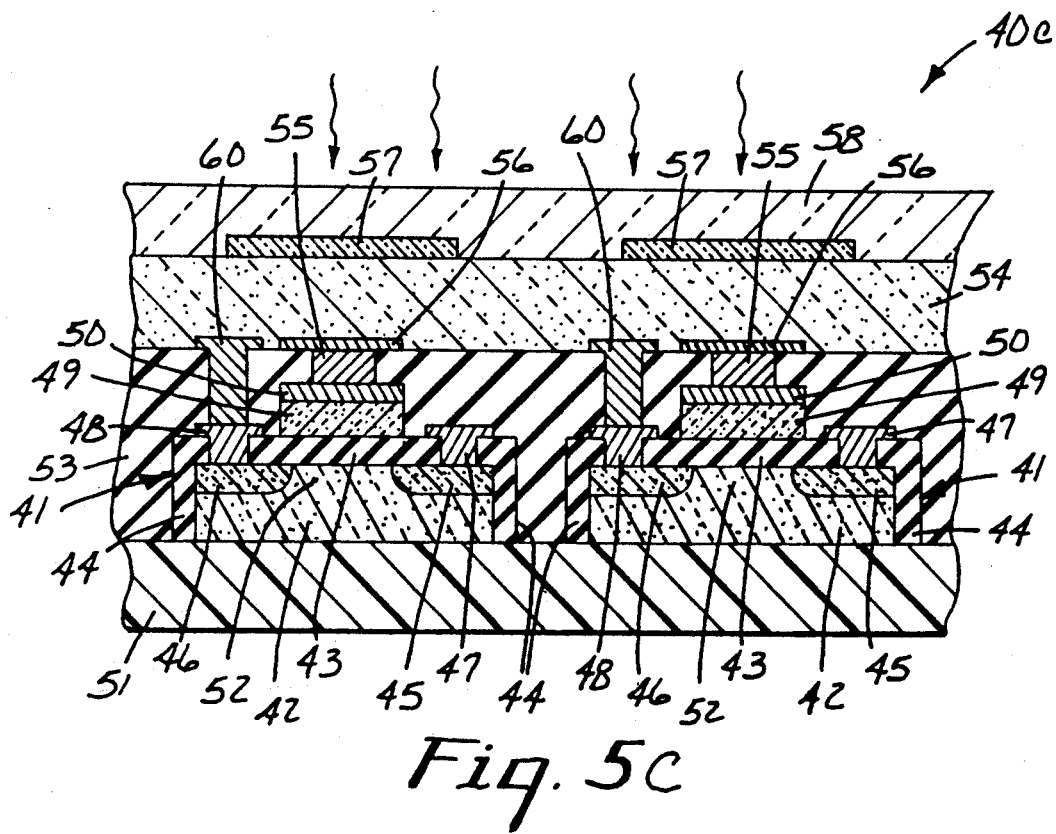
FIG. 5c is a side section of the solid state detector shown in FIG. 4 further comprising a phosphor layer.

As shown in FIG. 5c for the solid state detector 40c, a phosphor layer 58 optionally may be deposited, or physically placed, onto the top electrode layer 57 to make a solid state detector for detecting x-rays. For placing the phosphor layer 58 onto the top electrode layer, an optically matched glue is preferably used to maximize the number of photons that reach the energy sensitive layer 54. The phosphor layer 58 comprises a material that converts x-rays into light. Examples of such materials include $Gd_2O_2S:Tb$; $BaFBr:Eu$; $Sr_5SiO_4$; $SrSO_4$; $RbBr:Tl$; and $ZnS:Cu:Pb$. Such materials are described, for example, in U.S. Pat. No. 4,011,454 and European Patent Application No. 0175578-A3.

Figure 5D:
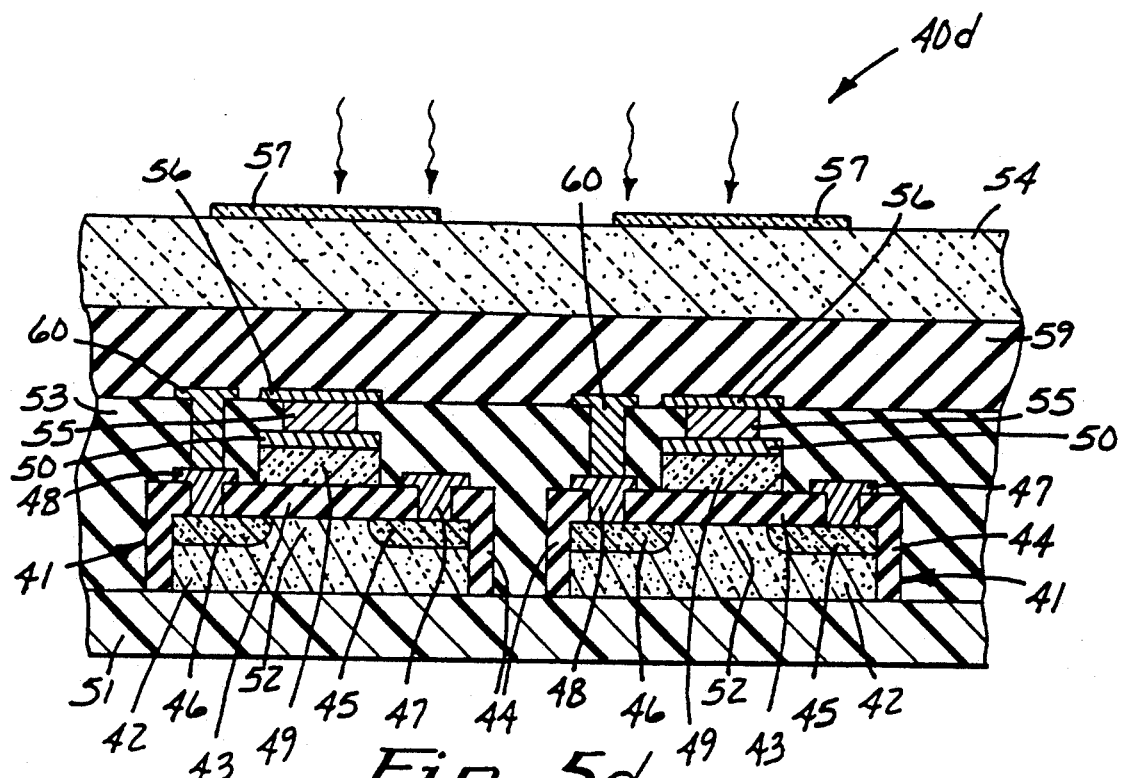
FIG. 5d is a side section of the solid state detector shown in FIG. 4, further comprising an additional insulating layer for charge storage.

As shown in FIG. 5d for the solid state detector 40d, at least one additional, insulating layer 59 may be interposed between the planarization layer 53 and the energy sensitive layer 54. The additional insulating layer 59 is used as a capacitance for additional charge storage and may comprise insulating materials such as $SiN_x$, $SiO_x$, and the like.

Figure 6:
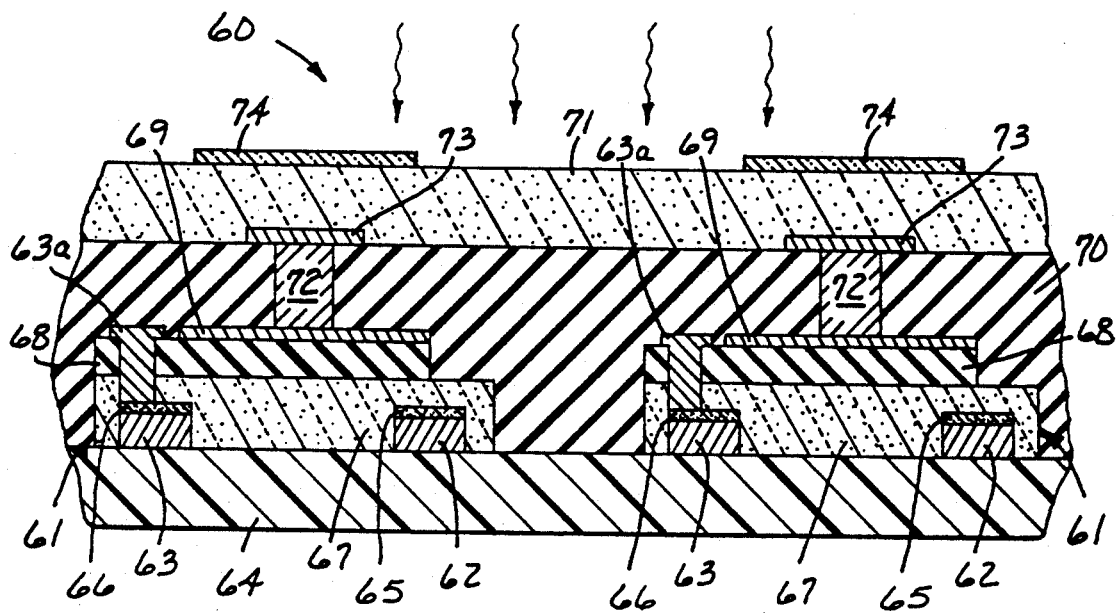
FIG. 6 is a side section of an alternative embodiment of the present invention.

FIG. 6 shows another preferred solid state radiation detector 60 of the present invention in which the field effect transistors 61 are hydrogenated amorphous silicon-based MOSFET's. In FIG. 6, the materials and thicknesses of each layer are the same as the corresponding layers described with reference to FIG. 4, unless otherwise noted. In FIG. 6, source and drain electrodes 62 and 63 are deposited onto the substrate 64. As one option, the substrate 64 may contain a base layer that is formed from a material such as quartz, glass, silicon, or metal. Yet, because hydrogenated amorphous silicon may be deposited onto the substrate 64 at relatively low temperatures, the base layer of the substrate 64 may also be formed from a flexible, polymeric material, e.g., polyimide, polyester, or polysulfone. Using conventional masking techniques, a 500 angstrom thick layer of n-type hydrogenated amorphous silicon is deposited by plasma-enhanced chemical vapor deposition onto each source and drain electrode 62 and 63 to form the source and drain regions 65 and 66, respectively.

A channel layer 67 of hydrogenated amorphous silicon is deposited over the source and drain regions 65 and 66. Typically, the channel layer 67 of hydrogenated amorphous silicon has a thickness of about 1000 to 10,000 angstroms, and more preferably of about 5000 angstroms.

A gate dielectric layer 68 is deposited onto the channel layer 67. The gate dielectric layer 68 has a thickness of from 1000 to 5000 angstroms. A gate electrode 69 (3000 to 5000 angstroms) comprising aluminum, chromium, or any other suitable electrode material, is then deposited onto the gate dielectric layer 68. Drain lead 63a is formed to provide ohmic contact between the drain region 66 and the corresponding drain line (not shown in FIG. 6). An array of thin film, hydrogenated amorphous silicon-based MOSFET's 61 supported upon the substrate 64 is thereby formed.

A planarization layer 70 is then deposited over the array of FET's 61 in order to electrically isolate the drain and source lines (not shown in FIG. 6). An energy sensitive layer 71 is deposited onto the planarization layer 71. A contact plug 72 and bottom electrode 73 electrically connect the energy sensitive layer 71 with the gate electrode 69 of each FET 61 of the array. A top electrode layer 74 is deposited onto the energy sensitive layer 70.

The invention will be further described with reference to the following examples.

EXAMPLE 1

A polysilicon-based solid state detector for detecting x-rays was made as follows:

First, an array of polysilicon-based MOSFETs supported on a substrate was prepared as follows. An insulating layer of $SiO_x$ was grown by thermal oxidation in dry oxygen at 1050° C. for 3 hours on a silicon wafer base layer. Next, a layer of undoped amorphous silicon having a thickness of 1500 angstroms was deposited onto the insulating layer at 560° C. and 180 millitorr by pyrolytic decomposition of silane using the low pressure chemical vapor deposition ("LPCVD") technique. The amorphous silicon was then annealed in a nitrogen atmosphere (1.5 Torr) at 620° C. for 24 hours to form a polysilicon layer, i.e., "LPCVD polysilicon". The LPCVD polysilicon layer was then patterned into islands using microlithography techniques to form a channel layer for each transistor of the array.

Next, a 1000 angstrom layer of $SiO_x$ was deposited over the polysilicon channel layers by thermal oxidation of the LPCVD polysilicon layer at 1150° C. in dry oxygen for 30 minutes. Using the techniques described above, a gate layer of LPCVD polysilicon was formed at 620° C. over the gate oxide layer. For each MOSFET, the polysilicon gate layer was etched to form the polysilicon gate.

In order to obtain a device having n-type characteristics, $3.7 \times 10^{15}/cm^2$ phosphorous was implanted to dope the source, the drain, and the polysilicon gate. The energy of the ion implanter was 175 keV. The dopants were activated during a 30 minute nitrogen anneal at 1050° C. The $SiO_x$ layer was then etched to open the drain and source region for electrode contact.

Next, a first layer of an aluminum alloy (1.0% Si, 0.4% Cu, 1000 angstroms) and a second layer of chromium (2000 angstroms) were sputtered onto the gate region, source region, and drain region to form the gate electrode, the source electrode, and the drain electrode, respectively. Source lines were also deposited at this time. Sputtering took place at a chamber pressure of $9 \times 10^{-7}$ Torr. Argon gas pressure was 7 millitorr, and the sputtering apparatus was operated at 500 W. The sputtering time for the aluminum alloy layer was 7 minutes, and the sputtering time for the chromium layer was 11 minutes.

The resulting array of thin film, field effect transistors was annealed in a forming gas (85% $N_2$, 15% $H_2$) at 400° C. for 30 minutes in order to enhance the adhesion and the contact of the electrodes to the source, drain, and gate regions. After this, the array of thin film, field effect transistors was subjected to a plasma hydrogenation treatment in order to reduce the dangling bonds at the grain boundaries of the polysilicon channel layer. This treatment took place at 300° C. and 0.55 Torr for 1.5 hours in an atmosphere of 50% $H_2$ and 50% $N_2$. The flow rates of the hydrogen and nitrogen were each 70 sccm, and power density was 1.36 $W/cm^2$. The equipment used for the treatment was operated with an electrode distance of 0.875 inches and a radio frequency of 13.56 MHz. Suitable equipment for performing the plasma hydrogenation treatment is commercially available, for example, from Plasma Technology, Concord, Mass., or Glass TechSolar, Boulder, Colo.

A planarization layer was deposited over the array of thin film, field effect transistors as follows. A first layer of $SiN_x$ having a thickness of 3000 angstroms was deposited over the array at 300° C. using the plasma-enhanced chemical vapor technique. This was followed by depositing a second layer of $SiO_x$ having a thickness of 2000 angstroms also at 300° C. using the plasma-enhanced chemical vapor technique. This was followed by depositing a third layer of $SiN_x$ having a thickness of 2000 angstroms using the same plasma-enhanced chemical vapor deposition technique. Deposition conditions for $SiN_x$ were a flow rate of $SiH_4$ of 17.3 sccm, a flow rate of $NH_3$ of 10.8 sccm, and a power density of 0.4 $W/cm^2$. Deposition conditions for $SiO_x$ were a flow rate of $SiH_4$ of 4.71 sccm, a flow rate of $N_2$ of 60 sccm, a flow rate of $N_2O$ of 17.1 sccm, and a power density of 0.06 $W/cm^2$.

Holes exposing the gate electrode of each field effect transistor of the array were formed in the planarization layer by using the gate electrode as a mask for the reactive ion etching of the planarization layer. Reactive ion etching was accomplished with 40 sccm $CF_4$ and 0.84 $O_2$ at 250 W for 16 minutes. After forming the holes, the holes were filled with plugs of chromium having a thickness of 6000 angstroms. Next, a 3000 angstrom thick chromium layer was deposited over the planarization layer. This layer was then patterned to form a discrete, bottom electrode for each transistor of the array. The size of the bottom electrode for each FET determined the gate size of the FET, and therefore, the pixel size of the resulting solid state detector. Drain lines were also deposited at this time.

Next, a layer of $SiN_x$ having a thickness of 3000 angstroms was deposited over the array using plasma-enhanced chemical vapor deposition techniques. The purpose of this layer was to provide additional capacitance for charge storage. An energy sensitive layer of hydrogenated amorphous silicon having a thickness of 1 micron was deposited over the entire array and was not patterned.

Next, a layer of indium tin oxide ("ITO") having a thickness of 6000 angstroms was deposited onto the energy sensitive layer at 100° C. and 200 W in 100 millitorr of argon gas using the sputtering technique. The ITO was then patterned to form common top electrode elements, each element covering the FET's in a column of the array.

A phosphor layer of $Gd_2O_2S:Tb$, commercially available as Trimax 12B from Minnesota Mining And Manufacturing Company, was physically laid on top of the detector. This layer was used to convert incident x-rays into visible light having a wavelength of 545 nm.

Optionally, the phosphor layer may be omitted. In such a case, the resulting solid state detector could be used for detecting visible light rather than for detecting x-ray radiation.

Figure 7:
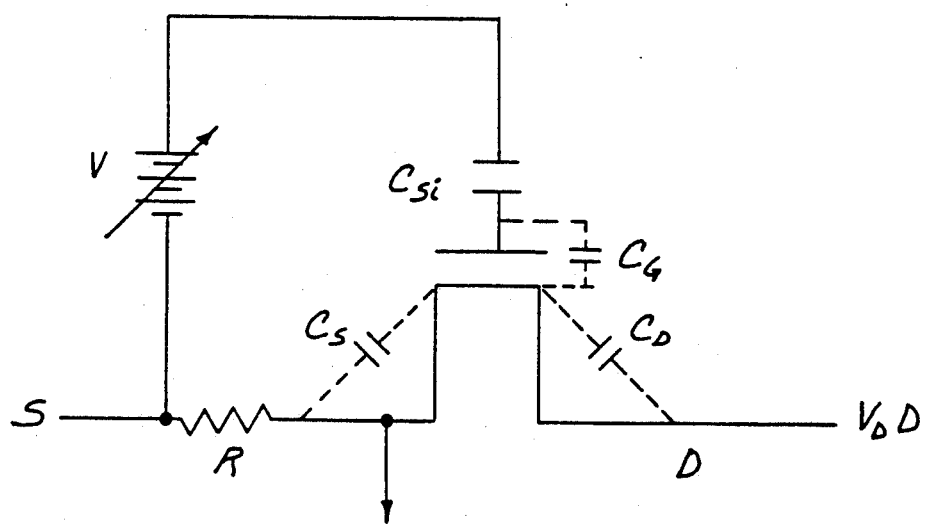
FIG. 7 is the equivalent circuitry for one FET of a solid state detector of the present invention.

Operation of the solid state detector in which the phosphor layer was deposited onto the top of the detector was as follows. A uniform charge was formed on the surface of the energy sensitive layer by applying a DC voltage as high as 10–20 volts between the drain electrode and the source electrode of each FET of the array. The voltage between the common, top electrode elements and each source electrode of the array, i.e., the gate voltage, was adjusted for optimum sensitivity between −5 V and 15 V. The energy sensitive layer of amorphous hydrogenated silicon acted as a capacitor ($C_{Si}$) which was effectively connected in series with the gate capacitor (floating gate, $C_G$). An equivalent circuitry of of the solid state detector, depicting a single FET of the array, is shown in FIG. 7. In this circuitry, $C_{Si}$, $C_S$, $C_d$ and $C_g$ are the capacitance of the energy sensitive layer, the source, the drain and the gate, respectively.

The solid state detector was exposed to x-ray illumination (90 kVp, 200 mA, 100 microseconds, 20 mm aluminum filter). The incident radiation was converted into green light (wavelength of 545 nm) by the phosphor layer which was then absorbed by the energy sensitive layer. This caused the charge in the energy sensitive layer to decrease, causing a drop in the gate voltage. This, in turn, caused a drop in the drain-source current. The change in the drain-source current was converted into a voltage by a resistor, R, and was detected as an output voltage signal. This signal was amplified, converted into digital by an A/D converter, and then stored in a memory.

EXAMPLE 2

A polysilicon-based solid state detector for directly detecting x-rays without requiring a phosphor layer would be prepared as follows. The procedure for making such a detector would be the same as the procedure described in Example 1, except that an energy sensitive layer of amorphous selenium having a thickness of 300 to 500 microns is substituted for the energy sensitive layer of hydrogenated amorphous silicon. The amorphous selenium is deposited at room temperature, using the thermal evaporation technique. It should be noted that selenium can undergo a phase change from the amorphous phase to a polycrystalline phase at temperatures as low as 50°–60° C. on of amorphous selenium should be done in several steps to avoid this phase change.

EXAMPLE 3

A polysilicon-based solid state detector for detecting infrared radiation was prepared as follows. The procedure for making such a detector was the same as the procedure described in Example 1, except that an energy sensitive layer containing $PVF_2$ was substituted for the energy sensitive layer of hydrogenated amorphous silicon. The energy sensitive layer containing $PVF_2$ was a blend of polyvinylidene fluoride ("$PVF_2$") and dimethylmethacrylate ("PMMA") as described in U.S. Pat. Nos. 4,606,871; 4,615,848; and 4,820,586. The blend was poled to establish pyroelectric properties. Preferred thickness of the energy sensitive layer ranged from about 3 to about 7 microns. Deposition and poling of the energy sensitive layer was as follows:

24 grams of PMMA were dissolved in 36 grams of methyl ethyl ketone ("MEK") and mixed thoroughly.

36 grams of $PVF_2$ and 304 grams of dimethylformamide ("DMF") were added to the PMMA solution, and the solution was thoroughly mixed again.

The resulting solution was coated over the array of thin film transistors by spin coating. Alternatively, the resulting solution may also be coated over the array by immersing the array in a container containing the $PVF_2$ blend and then withdrawing the array from the container at a rate of about 1.2 cm/minute. This would result in a coating thickness of about 5 microns. The coated array was then air dried at about room temperature in a dust-free environment until the coating became white, which was indicative of dryness.

After this, the coated array was heated in an oven for about 10 minutes at 60° C. to drive off the MEK. Then, the the temperature was raised to 140° C. and maintained at 140° C. for about 10 minutes in order to drive off the DMF. The temperature was increased again to 200° C. and maintained at 200° C. for about 5 minutes. The array was then cooled to room temperature, allowing the beta state of the $PVF_2$ to set.

Figure 8:
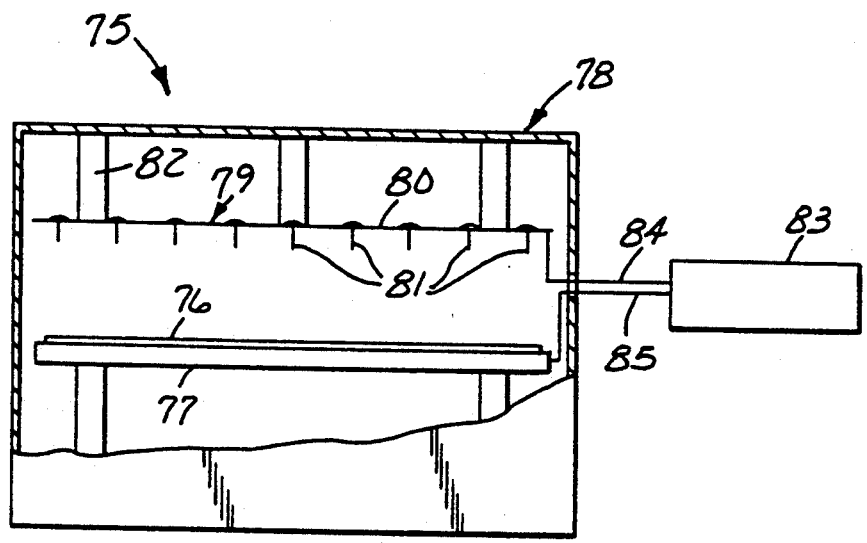
FIG. 8 shows an apparatus useful for poling an energy sensitive layer which comprises a $PVF_2$ blend.

Poling of the $PVF_2$ blend was accomplished by placing the coated array in an electric field of suitable strength to set the dipole moment of the $PVF_2$. The apparatus 75 of FIG. 8 is useful to accomplish the poling function. The coated array 76 was supported on a conductive support plate 77 which was placed in an oven 78. A corona generating array 79, comprising a conductive screen 80 and a pattern of conductive needles 81 was supported in, and electrically isolated from, the oven chamber by insulating support members 82. A corona power supply 83 (for example, CORONA-TROL ™, manufactured by Monroe Electronics, Inc., Lyndonville, N.Y.) was connected to support plate 77 and the corona array 79 by leads 84 and 85. The needles 81 were disposed in a two-dimensional geometrical pattern with separation between adjacent needles of about 12 mm. A distance of about 50 mm was maintained between the tips of needles 81 and the top surface of coated array 76. Poling was then achieved by inserting the coated array 76 into the oven 78, generating a corona discharge on the $PVF_2$ surface of 900 volts, gradually increasing the oven temperature to about 105° C. while maintaining said surface charge, and allowing the oven temperature to decline back to room temperature while still maintaining said surface charge.

Finally, the common, top electrode elements of aluminum were deposited over the gate region of each transistor of the array. In this structure, the common, top electrode elements absorbed and were heated by infrared radiation. The increase in temperature caused a corresponding increase in temperature of pyroelectric layer 29, which in turn caused a change in the gate voltage, and therefore a change in the drain-source current of the polysilicon-based thin film transistors.

EXAMPLE 4

A hydrogenated amorphous silicon-based solid state detector for detecting infrared radiation was prepared as follows. A layer of $SiO_2$ having a thickness of 1 micron was deposited onto a 3 inch×3 inch single crystal silicon wafer by thermal oxidation in dry oxygen. Next, a layer of chromium having a thickness of 3000 angstroms was deposited onto the layer of $SiO_2$. This was followed by using plasma-enhanced chemical deposition techniques to deposit a layer of n-type hydrogenated amorphous silicon (500 angstroms) onto the chromium layer. The n-type hydrogenated amorphous silicon was deposited using a process temperature of 250° C., a flow rate of SiH$_4$ of 21.2 sccm, a flow rate of 1% PH$_3$ diluted in hydrogen of 5.5 sccm, a flow rate of hydrogen of 76.4 sccm, and a power density of 0.043 W/cm$^2$. The chromium layer and the layer of n-type hydrogenated amorphous silicon were then etched to form the drain and source electrodes and the drain and source regions, respectively, for each FET of the array.

The entire array was then coated with a layer of intrinsic a-Si:H using the plasma-enhanced chemical vapor deposition technique. The layer of intrinsic a-Si:H was then patterned to form the channel layer for each thin film transistor of the array. A dielectric layer of SiN$_x$ (3000 angstroms) was then deposited onto the channel layer of each transistor, followed by the deposition of a gate electrode onto each dielectric layer. An energy sensitive layer of a PVF$_2$ blend and common, aluminum top electrode elements were coated over the array, and the PVF$_2$ blend was then poled as described in Example 3 to complete the detector.

Other embodiments of this invention will be apparent to those skilled in the art from a consideration of this specification or from practice of the invention disclosed herein. Various omissions, modifications, and changes to the principles described herein may be made by one skilled in the art without departing from the true scope and spirit from the invention which is indicated by the following claims.

What is claimed is:

1. A solid state detector for detecting electromagnetic radiation, comprising:
   (a) a substrate;
   (b) a plurality of field effect transistors deposited onto the substrate to form an array, wherein each field effect transistor has a gate electrode, and wherein a portion of the substrate contiguous to the field effect transistors comprises an insulating material;
   (c) a planarization layer deposited over the array of field effect transistors, wherein the planarization layer is formed from an insulating material;
   (d) an energy sensitive layer deposited onto the planarization layer;
   (e) a plurality of bottom electrodes interposed between the planarization layer and the energy sensitive layer, wherein each bottom electrode is electrically coupled to the gate electrode of a single, corresponding field effect transistor;
   (f) a top electrode layer deposited onto the energy sensitive layer; and
   (g) circuitry means for providing electronic read-out from each field effect transistor of the array.

2. The solid state detector of claim 1, wherein the field effect transistors are thin film, polysilicon-based, field effect transistors.

3. The solid state detector of claim 1, wherein the field effect transistors are thin film, single crystal silicon-based field effect transistors.

4. The solid state detector of claim 1, wherein the field effect transistors are thin film, hydrogenated amorphous silicon-based, field effect transistors.

5. The solid state detector of claim 1, wherein the field effect film transistors are thin film, cadmium selenide-based, field effect transistors.

6. The solid state detector of claim 1, wherein the energy sensitive layer comprises an x-ray sensitive material.

7. The solid state detector of claim 1, wherein the energy sensitive layer comprises a visible light sensitive material.

8. The solid state detector of claim 1, wherein the energy sensitive layer comprises an infrared sensitive material.

9. The solid state detector of claim 1, wherein the energy sensitive layer comprises an ultraviolet sensitive material.

10. The solid state detector of claim 1, wherein the energy sensitive layer comprises a material selected from the group consisting of amorphous selenium; cadmium telluride; cadmium selenide; cadmium sulfide; mercury cadmium telluride; selenium-based alloys; telluride-based alloys; selenium-tellurium; hydrogenated amorphous silicon and alloys thereof; polyvinylidene fluoride ("PVF$_2$"); a blend of PVF$_2$ and at least one polymer which is miscible with PVF$_2$ at a temperature above the melting point of PVF$_2$; vinyl fluoride; vinyl chloride; vinylidene chloride; chlorofluorovinylidene; trifluoroethylene; poly-N-vinyl-carbazole; trinitrofluorenone; lithium niobate; lithium tantalate; Sr$_{1-x}$Ba$_2$O$_x$; pyrargyrite; Tl$_3$AsSe$_3$; PbO; ZnO; and organic photoconductive materials.

11. The solid state detector of claim 1, wherein the energy sensitive material is a blend of PVF$_2$ and at least one polymer which is miscible with PVF$_2$ at a temperature above the melting point of PVF$_2$.

12. The solid state detector of claim 1, wherein the density of the thin film transistors in the array is more than 50×50 thin film transistors per square centimeter.

13. The solid state detector of claim 1, further comprising a phosphor layer deposited onto the top of the solid state detector.

14. The solid state detector of claim 13, wherein the phosphor layer comprises a compound selected from the group consisting of Gd$_2$O$_2$S:Tb; BaFBr:Eu; Sr$_5$SiO$_4$; SrSO$_4$; RbBr:Tl; and ZnS:Cu:Pb.

15. The solid state detector of claim 1, further comprising an insulating layer for additional charge storage interposed between the planarization layer and the energy sensitive layer.

* * * * *

UNITED STATES PATENT AND TRADEMARK OFFICE
CERTIFICATE OF CORRECTION

PATENT NO. : 5,235,195
DATED : August 10, 1993
INVENTOR(S) : Tran et al.

It is certified that error appears in the above-indentified patent and that said Letters Patent is hereby corrected as shown below:

Col. 15, line 48, "on" should be --Thus, the deposition--.

Signed and Sealed this

Nineteenth Day of April, 1994

Attest:

BRUCE LEHMAN

*Attesting Officer*  *Commissioner of Patents and Trademarks*